(12) United States Patent
Cha

(10) Patent No.: US 6,532,186 B2
(45) Date of Patent: Mar. 11, 2003

(54) SEMICONDUCTOR MEMORY DEVICE HAVING SENSING POWER DRIVER

(75) Inventor: Jae Yong Cha, Kyongki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/032,656

(22) Filed: Dec. 28, 2001

(65) Prior Publication Data
US 2002/0097614 A1 Jul. 25, 2002

(30) Foreign Application Priority Data

Dec. 29, 2000 (KR) ........................................ 2000-86311

(51) Int. Cl.[7] ................................................ G11C 8/00
(52) U.S. Cl. .................................. 365/230.03; 365/207
(58) Field of Search ........................... 365/230.03, 207, 365/189.11, 230.06, 226

(56) References Cited

U.S. PATENT DOCUMENTS

| | | | |
|---|---|---|---|
| 5,272,677 A | * 12/1993 | Yamamura | 365/230.03 |
| 5,280,450 A | 1/1994 | Nakagome et al. | 365/189.03 |
| 5,495,454 A | * 2/1996 | Fukuzo | 365/230.03 |
| 5,650,972 A | 7/1997 | Tomishima et al. | 365/207 |
| 5,671,188 A | * 9/1997 | Patel et al. | 365/207 |
| 5,822,262 A | * 10/1998 | Hashimoto et al. | 365/207 |
| 5,966,341 A | * 10/1999 | Takahashi et al. | 365/230.03 |
| 6,392,951 B2 | * 5/2002 | Fujima et al. | 365/207 |

OTHER PUBLICATIONS

U.K. Search Report dated Jul. 31, 2002.

* cited by examiner

Primary Examiner—Tan T. Nguyen
(74) Attorney, Agent, or Firm—Marshall, Gerstein & Borun

(57) ABSTRACT

A semiconductor memory device having a sense amplifier control circuit is disclosed. At least two sensing power drivers among the plurality of sensing power drivers for driving sensing power in a selected sense amplifier array block are commonly connected to common sensing power lines by a plurality of switching units controlled according to sensing power supply control signals generated by using block select address signals, thereby improving a driving capacity of the sensing power drivers and a sensing speed.

3 Claims, 4 Drawing Sheets

SEMICONDUCTOR MEMORY DEVICE HAVING SENSING POWER DRIVER

BACKGROUND

1. Technical Field

The present invention relates to semiconductor memory devices, and in particular to semiconductor memory devices and sense amplifier control circuits thereof that can improve power serviceability of sensing power drivers, as well as improve sensing speed of bit line sense amplifiers by selectively connecting at least two sensing power drivers of one block to common sensing power lines.

2. Description of the Background Art

In general, methods for supplying sensing power RTO and /S to a sense amplifier may be classified as a method for driving a word line using a metal strap or a method for driving a word line using a sub-word line.

The former method was suggested in early development stages of semiconductor memory devices. Here, the sensing power is coupled to a sense amplifier outside a cell array block according to a block select address. In this method, power serviceability is decided according to a magnitude of the sensing power RTO and /S existing outside a memory cell array. According to this method, one sensing power RTO and /S exists in a block controlled according to the block select address.

The latter method has been more recently used. Here, sensing power drivers are aligned in sub-holes formed in the regions where sub-word line array regions and a sense amplifier array block cross one another between memory cell array blocks, and the sensing power RTO and /S is controlled according to sensing power supply control signals RTOEN and /SEN including a block address.

FIG. 1 is a block diagram illustrating a conventional semiconductor memory device for supplying the sensing power RTO and /S of a bit line sense amplifier to a bit line sense amplifier array block.

Referring to FIG. 1, a plurality of memory cell array blocks 1 are aligned in one bank in a matrix-type configuration. Bit line sense amplifier array blocks 2a and 2b are connected to both side ends of the memory cell array blocks 1. Sensing power drivers 3a, 3b, 3c and 3d for supplying the sensing power RTO and /S to the bit line sense amplifier array blocks 2a and 2b are aligned in each sub-hole. Sensing power supply control signal lines RTOEN0 and /SEN0, which supply sensing power supply control signals RTOEN and /SEN for controlling the sensing power drivers 3a, 3b, 3c and 3d, are aligned between the memory cell array blocks 1. Sensing power lines RTO0 and /S0 that supply the sensing power RTO and /S are driven according to the sensing power drivers 3a, 3b, 3c and 3d and are coupled to the bit line sense amplifier array blocks 2a and 2b are positioned between the sensing power supply control signal lines RTOEN0 and /SEN0.

As illustrated in FIG. 2, the sensing power driver 3a includes NMOS transistors NM1–NM3 controlled according to a bit line precharge control signal BLP, for precharging and equalizing the sensing power lines RTO0 and /S0 to a precharge voltage VBLP and a PMOS transistor PM1 controlled according to the sensing power supply control signal RTOEN0, for selectively transmitting an external power voltage VEXT to the sensing power line RTO0. The sensing power driver 3a also includes an NMOS transistor NM4 controlled according to the sensing power supply control signal /SEN0, to selectively connect the sensing power line /S0 to a ground.

The operation of the conventional sensing power driving circuit of the bit line sense amplifier are now explained.

The sensing power drivers 3a, 3b, 3c and 3d are aligned in the sub-holes formed in the regions where sub-word line array regions 4a and 4b and the sense amplifier array blocks 2a and 2b cross one another. The sensing power drivers 3a, 3b, 3c and 3d are controlled according to the sensing power supply control signals RTOEN0, RTOEN1, /SEN0 and /SEN1.

For example, when an i-th word line WLi of the memory cell array block 1 of FIG. 1 is selected, the bit line sense amplifier array blocks 2a and 2b, which are positioned at both side ends of the memory cell array block 1, sense and amplify data in a read or write operation. Here, the sensing powers RTO0, /S0, RTO1 and /S1 of the bit line sense amplifier array blocks 2a and 2b for reading or writing data of the selected memory cell array block 1 are respectively controlled according to the sensing power supply control signals RTOEN0, /SEN0, RTOEN1 and /SEN1. That is, when the i-th word line WLi is enabled, the sensing power supply control signals RTOEN0, /SEN0, RTOEN1 and /SEN1 are enabled according to the block select address.

When the sensing power supply control signals RTOEN0, /SEN0, RTOEN1 and /SEN1 are enabled, the PMOS transistor PM1 and the NMOS transistor NM4 are turned on according to the arrangement of FIG. 2, thereby supplying the external power voltage VEXT and the ground voltage VSS to the sensing power lines RTO0 and /S0, respectively.

Because the NMOS transistors NM1–NM3 have been already turned on according to the bit line precharge control signal BLP, the sensing power lines RTO0 and /S0 were precharged to the precharge voltage VBLP.

Therefore, the sensing lines RTO and /S are aligned in the sub-holes, and driven by the sensing power driver 3a controlled according to the sensing power supply control signals RTOEN0, /SEN0, RTOEN1 and /SEN1. As a result, when a sub-hole area is decreased due to reduction of the sense amplifier array blocks and the sub-word line regions according to high integration of the semiconductor memory device, a size of the sensing power drivers is also reduced, which results in low driving capacity.

SUMMARY

According to one aspect, the disclosed device may be a semiconductor memory device that may include a plurality of memory cell array blocks aligned in a matrix-type configuration and a plurality of sense amplifier array blocks for sensing and amplifying data stored in the respective memory cell array blocks. The disclosed device may also include a plurality of sensing power drivers for supplying sensing power to the respective sense amplifier array blocks according to sensing power supply control signals and a plurality of switches for commonly connecting output terminals of at least two sensing power drivers to common sensing power lines according to the sensing power supply control signals.

In such an arrangement, the sensing power supply control signals may be generated using block select address signals. Additionally, the switches may be formed in sub-holes.

DETAILED DESCRIPTION

The disclosed device provides sensing power by driving a semiconductor memory device with at least two sensing power drivers, and by giving sufficient driving capacity to the semiconductor memory device through common sensing power lines.

Figure 1:
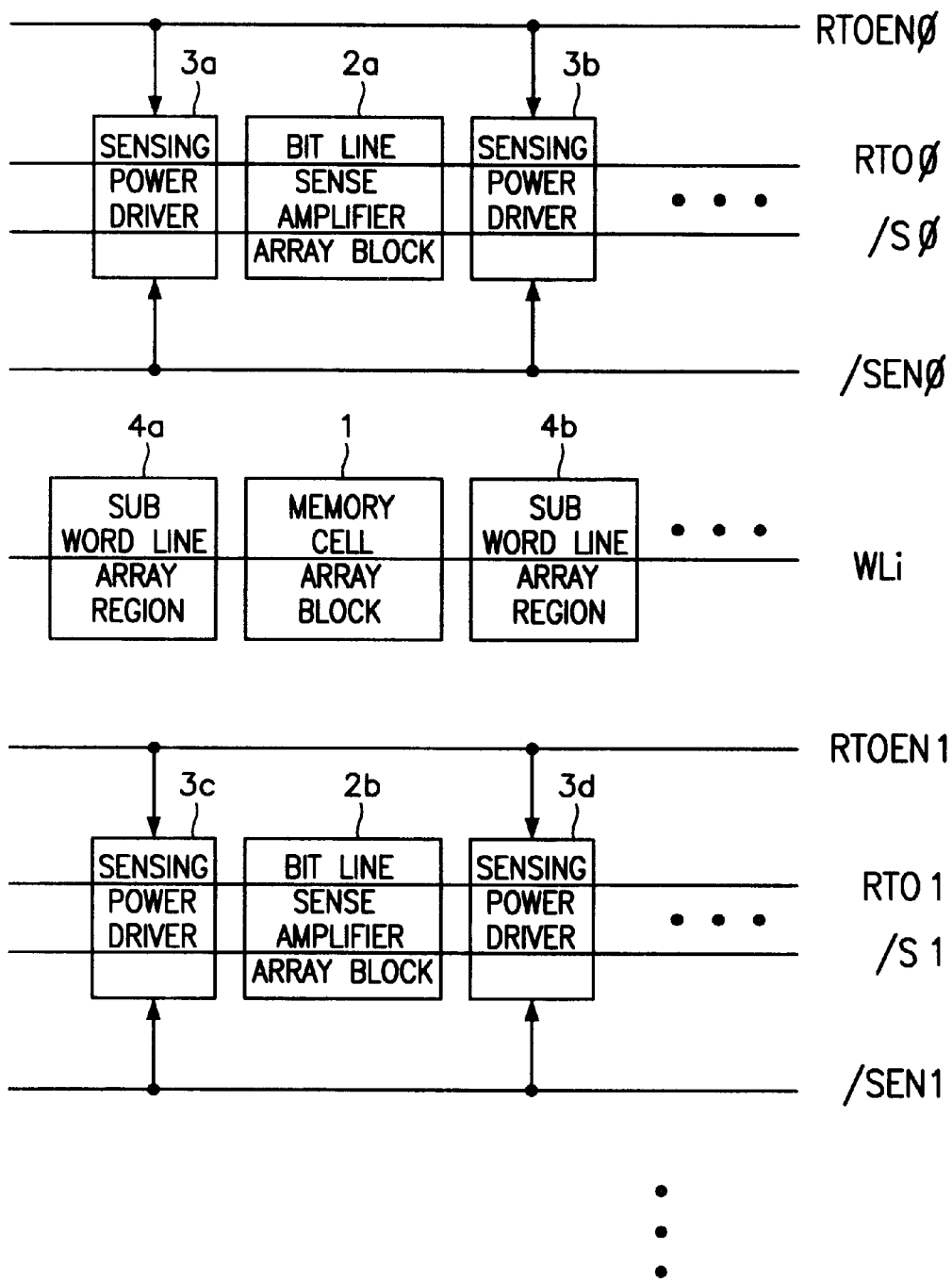
FIG. 1 is a block diagram illustrating a conventional semiconductor memory device for supplying sensing power of a bit line sense amplifier to a bit line sense amplifier array block.
Figure 2:
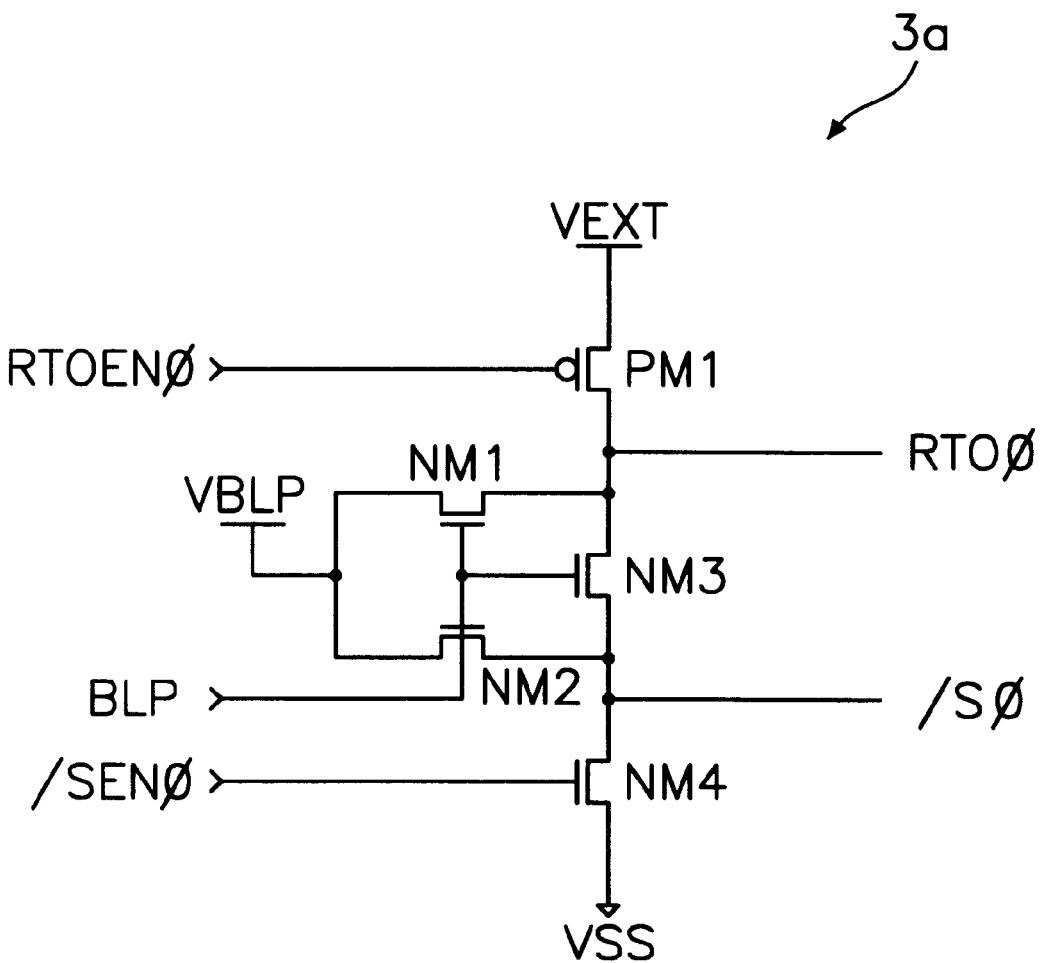
FIG. 2 is a circuit diagram illustrating a sensing power driver of FIG. 1.
Figure 3:
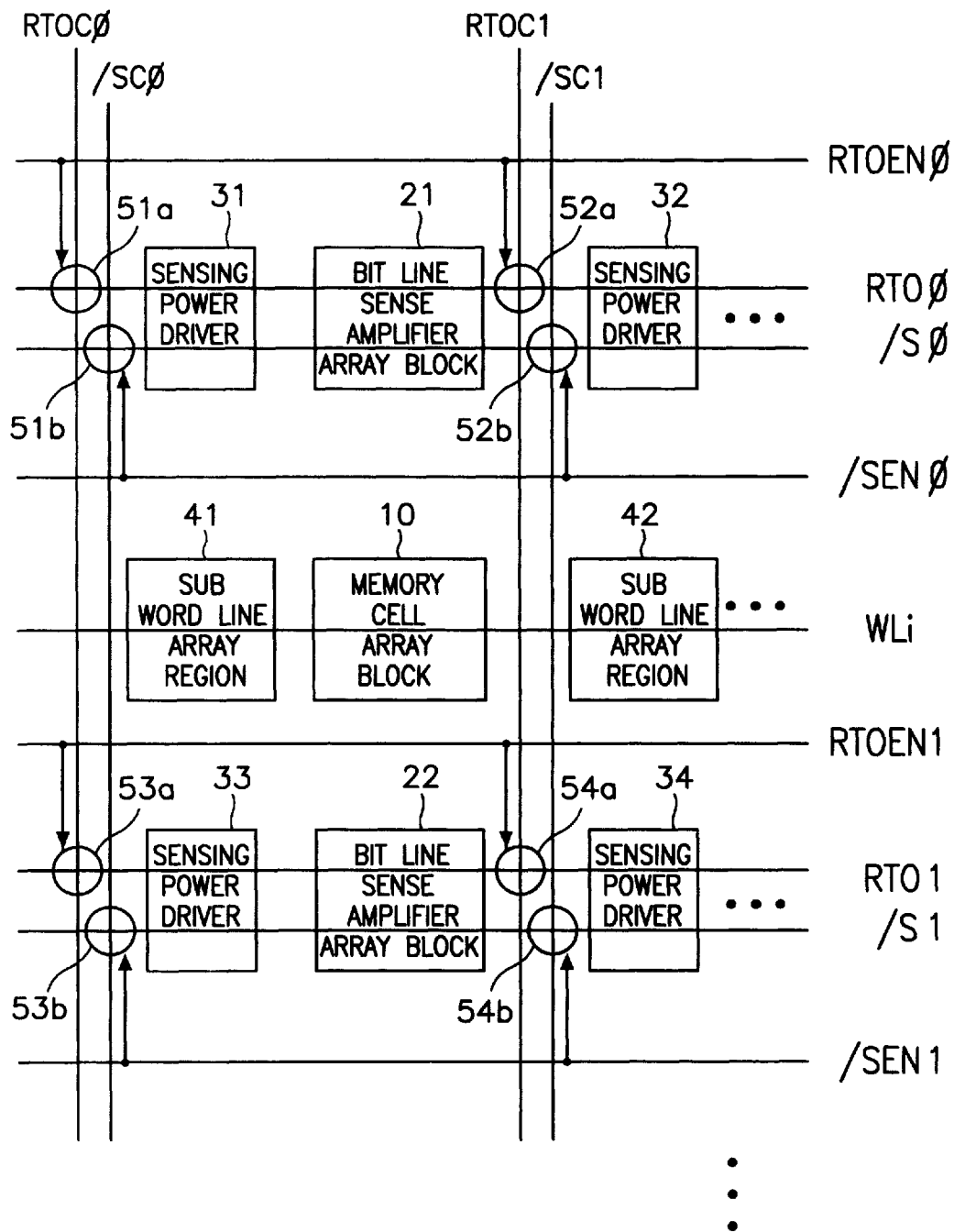
FIG. 3 is a block diagram illustrating a disclosed semiconductor memory device.

Referring to FIG. 3, a plurality of memory cell array blocks 10 are aligned in one bank in a matrix type. Bit line sense amplifier array blocks 21 and 22 are connected to both side ends of the memory cell array blocks 10. Sensing power drivers 31, 32, 33 and 34 that supply sensing power RTO and /S to the bit line sense amplifier array blocks 21 and 22 are aligned in each sub-hole formed in the regions where sub-word line array regions 41 and 42 and the bit line sense amplifier array blocks 21 and 22 cross one another. Sensing power supply control signal lines RTOEN0, /SEN0, RTOEN1 and /SEN1, which supply sensing power supply control signals RTOEN and /SEN, and a block select address signal for controlling the sensing power drivers 31, 32, 33 and 34 that are aligned between the memory cell array blocks 10. Sensing power lines RTO0, /S0, RTO1 and /S for supplying the sensing power RTO and /S, which driven according to the sensing power drivers 31, 32, 33 and 34 to the bit line sense amplifier array blocks 21 and 22, are positioned between the sensing power supply control signal lines RTOEN0, /SEN0, RTOEN1 and /SEN1.

In addition, a plurality of switching units 51a–54a and 51b–54b, which selectively connect the plurality of sensing power lines RTO0, /S0, RTO1, and /S1 to the common sensing power lines RTOC0, /SC0, RTOC1, and /SC1 according to the sensing power supply control signals RTOEN and /SEN, are connected to both side ends of the sensing power drivers 31, 32, 33 and 34.

Figure 4:
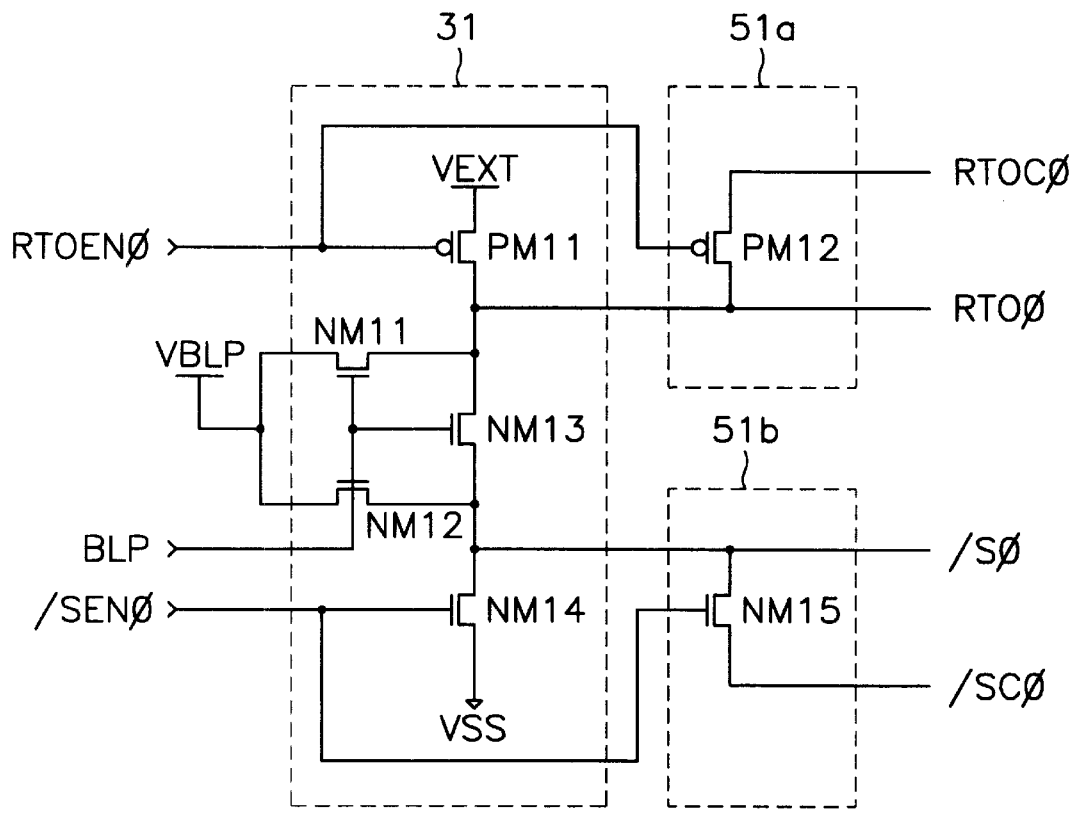
FIG. 4 is a circuit diagram illustrating further detail of the sensing power driver and the switching unit of FIG. 3.

FIG. 4 is a circuit diagram illustrating the sensing power driver 31 and the switching unit 51a and 51b of FIG. 3.

As depicted in FIG. 4, the sensing power driver 31 includes NMOS transistors NM11 and NM12 controlled according to a bit line precharge control signal BLP, for precharging the sensing power lines RTO0 and /S0 to a precharge voltage VBLP and an NMOS transistor NM13 controlled according to the bit line precharge control signal BLP, for equalizing the sensing power lines RTO0 and /S0. The power driver 31 further includes a PMOS transistor PM11 controlled according to the sensing power supply control signal RTOEN0, for selectively transmitting an external power voltage VEXT to the sensing power line RTO0 and an NMOS transistor NM14 controlled according to the sensing power supply control signal /SEN0, for selectively connecting the sensing power line /S0 to a ground. The switching unit 51a of FIG. 4 includes a PMOS transistor PM12 controlled according to the sensing power supply control signal RTOEN0, for selectively connecting the sensing power line RTO0 to the common sensing power line RTOC0. The switching unit 51b includes an NMOS transistor NM15 controlled according to the sensing power supply control signal /SEN0, for selectively connecting the sensing power line /S0 to the common sensing power line /SC0.

The operation of the disclosed device is now explained.

The sensing power drivers 31, 32, 33 and 34 are aligned in sub-holes formed in the regions where the sub-word line array regions and the sense amplifier array blocks 21 and 22 cross one another. The sensing power drivers 31, 32, 33 and 34 are controlled according to the sensing power supply control signals RTOEN0, /SEN0, RTOEN1 and /SEN1.

For example, when an i-th word line WLi of the memory cell array block 10 of FIG. 3 is selected, data are read or written by using bit line sense amplifiers (not shown) of the bit line sense amplifier array blocks 21 and 22, which are positioned at both side ends of the memory cell array block 10. Here, the sensing power RTO0, /S0, RTO1 and /S1 of the bit line sense amplifiers (not shown) is driven by the sensing power drivers 31, 32, 33 and 34 connected respectively through the common sensing power lines RTOC0, /SC0, RTOC1, /SC1, RTOC2, /SC2, RTOC3 and /SC3. That is, the sensing power supply control signals RTOEN0, /SEN0, RTOEN1 and /SEN1 are enabled to drive the sensing power drivers 31, 32, 33 and 34.

When the sensing power supply control signals RTOEN0, /SEN0, RTOEN1 and /SEN1 are enabled, the PMOS transistor PM11 and the NMOS transistor NM14 of the sensing power driver 31 of FIG. 4 are turned on to supply the external power voltage VEXT and the ground voltage VSS to the sensing power lines RTO0 and /S0. The PMOS transistor PM12 and the NMOS transistor NM15 of the switching units 51a and 51b are turned on to connect the sensing power lines RTO0 and /S0 to the common sensing power lines RTOC0 and /SC0.

Because the NMOS transistors NM11–NM13 have been turned on according to the bit line precharge control signal BLP, the sensing power lines RTO0 and /S0 were precharged to the precharge voltage VBLP.

Here, the sensing power supply control signals RTOEN0 and /SEN0, which are generated according to the block select address, adjust sensing power supply of the sense amplifier array blocks 21 and 22.

Accordingly, the sensing power supply control signals RTOEN0, /SEN0, RTOEN1 and /SEN1 for enabling the sensing power drivers 31, 32, 33 and 34, which are connected to the common sensing power lines RTOC0 and /SC0, are enabled according to the block select address of the selected memory cell array block 10. Thus the sensing power RTO and /S of the sense amplifier array blocks 21 and 22 is controlled according to the sensing power lines RTO0 and /S0 connected to the common sensing power lines RTOC0 and /SC0.

As discussed earlier, in accordance with the disclosed device, the driving capacity is improved by commonly connecting the sensing power supply lines, which results in a high sensing speed.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A semiconductor memory device, comprising:
   a plurality of memory cell array blocks aligned in a matrix-type configuration;
   a plurality of sense amplifier array blocks for sensing and amplifying data stored in the respective memory cell array blocks;

a plurality of sensing power drivers for supplying sensing power to the respective sense amplifier array blocks according to sensing power supply control signals; and a plurality of switches for commonly connecting output terminals of at least two sensing power drivers to common sensing power lines according to the sensing power supply control signals.

2. The semiconductor memory device according to claim 1, wherein the sensing power supply control signals are generated using block select address signals.

3. The semiconductor memory device according to claim 1, wherein the switches are formed in sub-holes.

* * * * *